United States Patent
Sohn (10) Patent No.: US 7,710,525 B2
(45) Date of Patent: May 4, 2010

(54) THIN FILM TRANSISTOR, FABRICATION METHOD THEREOF, LIQUID CRYSTAL DISPLAY PANEL DEVICE HAVING THE SAME, AND FABRICATION METHOD THEREOF

(75) Inventor: Choong Yong Sohn, Cheongjoo-si (KR)

(73) Assignee: LG Display Co., Ltd., Seoul (KR)

( * ) Notice: Subject to any disclaimer, the term of this patent is extended or adjusted under 35 U.S.C. 154(b) by 1224 days.

(21) Appl. No.: 11/259,029

(22) Filed: Oct. 27, 2005

(65) Prior Publication Data

US 2006/0258034 A1 Nov. 16, 2006

(30) Foreign Application Priority Data

May 13, 2005 (KR) .................. 10-2005-0039950

(51) Int. Cl.
*G02F 1/1343* (2006.01)
*H01L 21/00* (2006.01)
*H01L 33/00* (2010.01)

(52) U.S. Cl. .................. 349/141; 349/139; 438/30; 257/88

(58) Field of Classification Search .................. None
See application file for complete search history.

(56) References Cited

U.S. PATENT DOCUMENTS 5,247,375 A * 9/1993 Mochizuki et al. ............ 349/84

2004/0206983 A1 * 10/2004 Yi et al. ...................... 257/202
2006/0070274 A1 * 4/2006 Maack ........................ 40/447

FOREIGN PATENT DOCUMENTS

| CN | 1254948 A | 5/2000 |
| CN | 1389843 A | 1/2003 |
| JP | 4-165678 | 6/1992 |

* cited by examiner

*Primary Examiner*—Michelle R Connelly Cushwa
(74) *Attorney, Agent, or Firm*—McKenna Long & Aldridge LLP (57) ABSTRACT

A TFT that provides an efficient layout, a fabrication method thereof, an LCD device having the TFT, and a fabrication method thereof are provided. The TFT has a gate electrode and source/drain electrodes with an active layer interposed. The source electrodes and the drain electrodes are alternated in a vertical direction and a horizontal direction. Thus, the same source electrodes and the same drain electrodes are arranged in a diagonal direction. Source lines are connected with the source electrodes arranged in a diagonal direction and drain lines are connected with the drain electrodes arranged in a diagonal direction. Since a channel width is formed between the source electrode and adjacent drain electrodes, the channel width can be maximized within a limited area. Also, the source lines and the drain lines are arranged in a diagonal direction, so that an area use rate is maximized.

9 Claims, 6 Drawing Sheets

THIN FILM TRANSISTOR, FABRICATION METHOD THEREOF, LIQUID CRYSTAL DISPLAY PANEL DEVICE HAVING THE SAME, AND FABRICATION METHOD THEREOF

This application claims the benefit of Korean Patent Application No. 39950/2005, filed May 13, 2005, which is hereby incorporated by reference for all purposes as if fully set forth herein.

BACKGROUND OF THE INVENTION

1. Field of the Invention

The present invention relates to a thin film transistor (TFT), and more particularly, to a TFT that has an efficient layout, a fabrication method thereof, a liquid crystal display (LCD) device having the TFT, and a fabrication method thereof.

2. Discussion of the Related Art

An LCD device is spot-lighted as a next-generation display device of light weight, slim profile, and low power consumption that is convenient to carry with, technology-concentrated, and a high value-added product.

With liquid crystal (LC) interposed between two substrates, the LCD device displays a predetermined image using a difference in refractive index of light due to anisotropy of the LC.

An active matrix liquid crystal display (AMLCD) device in which TFTs and pixel electrodes are arranged in a matrix has excellent resolution and an excellent moving-image realization capability, and thus is becoming more prevalent in the market.

Figure 1:
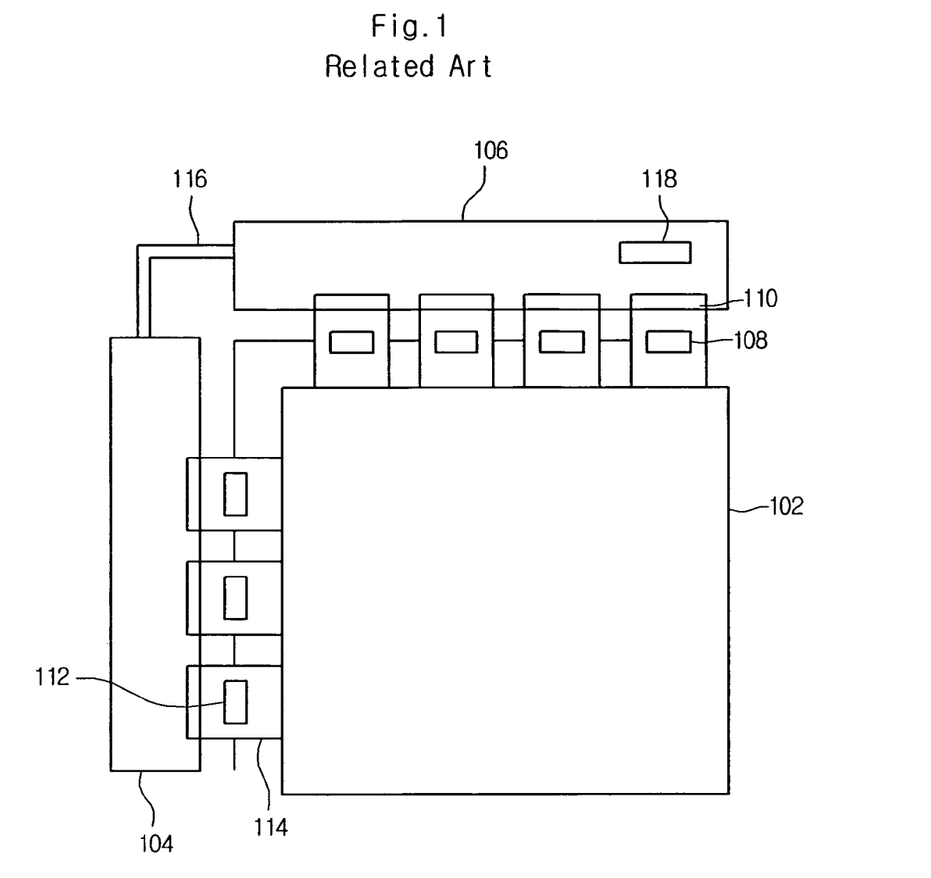
FIG. 1 is a schematic view of the related art LCD device.

FIG. 1 is a schematic view illustrating the related art LCD device.

As illustrated in FIG. 1, driver integrated circuits (ICs) 108 and 112 are mounted in a tape automated bonding (TAB) type. That is, gate driver ICs 112 are mounted on gate tape carrier packages (TCPs) 114 and data driver ICs 108 are mounted on data TCPs 110.

A gate printed circuit board (PCB) 104 is connected with an LC panel 102 by the gate TCP 114 and a data PCB 106 is connected with the LC panel 102 by the data TCP 110.

The data PCB 106 generates a data control signal for controlling the data driver IC 108 and supplies the data control signal and predetermined video data to the data driver IC 108. For that purpose, the data PCB 106 has a signal pad 118. The signal pad is a terminal for receiving video data and vertical/horizontal synchronization signals (Vsync, Hsync) from an outside. The data control signal is generated by the Vsync and Hsync.

The data PCB 106 is electrically connected with the gate PCB 104 by a flexible printed circuit (FPC) 116.

The gate PCB 104 generates a gate control signal for controlling the gate driver IC 112 using Vsync/Hsync signals inputted from the signal pad 118 of the data PCB 106 to supply the generated gate control signal to the gate driver IC 112.

As described above, because the gate PCB and the data PCB are separately provided in the related art LCD device and because the gate driver IC and the data driver IC are a chip that must be mounted on the TCP separately, the number of parts in the display increases, manufacturing costs increase, and the process becomes more complicated.

In the related art LCD device, as resolution increases, the size of the pitch of a pad connecting the TCP with gate lines or data lines decreases, causing a problem in that bonding between a TCP metal line and the pad is not easy achieved.

Therefore, technology for mounting a driver circuit for driving an LC panel in the inside of the LC panel has been developed.

The driver circuit has a plurality of TFTs. For example, a gate driver mounted within the LC panel has a plurality of shift registers and a plurality of TFTs for controlling respective outputs of the shift registers.

In this case, for the driver circuit to be reliable, each TFT should have an exact and swift switching function. For that purpose, the TFT should have good charge mobility and a good current-driving ability. To meet these requirements, a channel of the TFT should be widened as much as possible.

However, when the channel width of the TFT is widened, because the area occupied by the driver circuit becomes large and the size of a bezel area at the outer edge of a screen becomes large, a screen's display area is reduced. Therefore, to secure a screen of the same size, the size of the LC panel should increase.

SUMMARY OF THE INVENTION

Accordingly, the present invention is directed to a TFT capable of maximizing use rate of a limited area by designing a driver circuit having an effective layout, a fabrication method thereof, a liquid crystal display (LCD) device having the TFT, and a fabrication method thereof that substantially obviates one or more problems due to limitations and disadvantages of the related art.

An advantage of the present invention is to provide a TFT, a fabrication method thereof, an LCD device having the TFT, and a fabrication method thereof, capable of maximizing a channel width by forming the TFT in a mesh type so that improves electric characteristics of the TFT and minimizes the area occupied by a driver circuit.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a TFT including: a gate electrode; an active layer formed on the gate electrode; source electrodes and drain electrodes alternately arranged to each other in the form of an island on the active layer; and source lines and drain lines connected with the source electrodes and the drain electrodes, respectively.

In the second aspect of the present invention, there is provided a TFT including: a gate electrode having gate holes formed therein; an active layer formed on the gate electrode; source electrodes and drain electrodes alternately arranged to each other in the form of an island on the active layer and that correspond to the gate holes; source lines and drain lines connected with the source electrodes and the drain electrodes, respectively.

In the third aspect of the present invention, there is provided an LCD device including: a driver circuit having TFTs for controlling outputs; and an LC panel for displaying a predetermined image in response to a signal outputted from the driver circuit, each of the TFTs including a gate electrode; an active layer formed on the gate electrode; source electrodes and drain electrodes alternately arranged to each other in the form of an island on the active layer; and source lines and drain lines connected with the source electrodes and the drain electrodes, respectively.

In the fourth aspect of the present invention, there is provided a method of fabricating a TFT including: forming a gate electrode on a substrate; forming an active layer on the gate electrode; forming source electrodes and drain electrodes alternately arranged to each other in the form of an island on the active layer; and forming source lines and drain lines connected with the source electrodes and the drain electrodes, respectively.

In the fifth aspect of the present invention, there is provided a method of fabricating a TFT including: forming a gate electrode having gate holes formed therein; forming an active layer on the gate electrode; forming source electrodes and drain electrodes alternately arranged to each other in the form of an island on the active layer and that correspond to the gate holes; and forming source lines and drain lines connected with the source electrodes and the drain electrodes, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to embodiments of the present invention, examples of which are illustrated in the accompanying drawings.

Figure 2A:
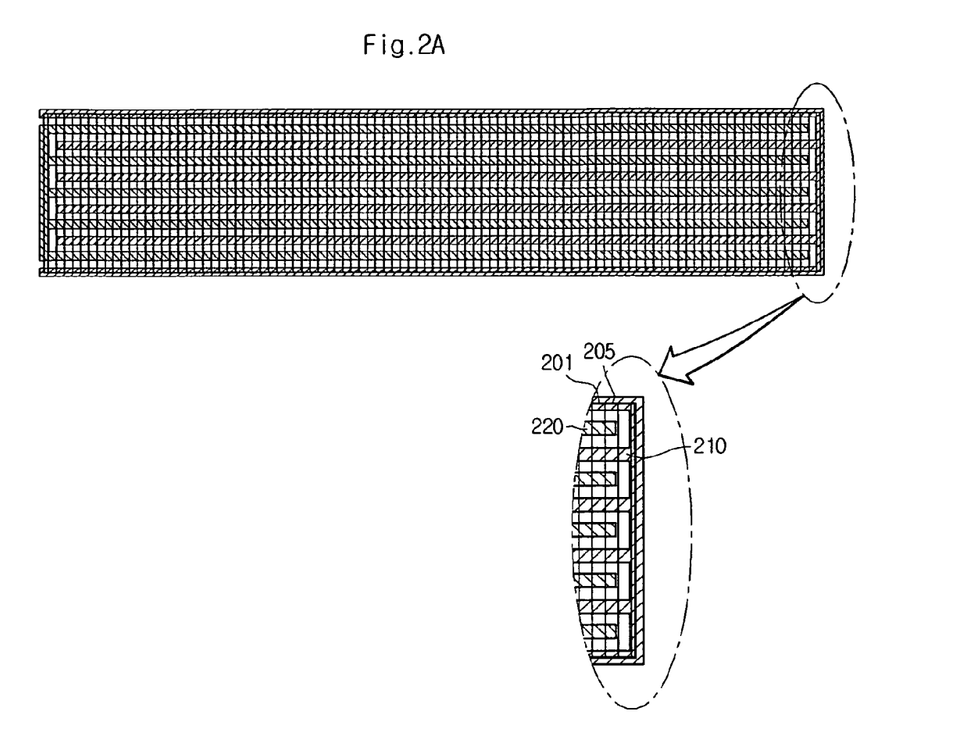
FIGS. 2A and 2B are schematic plan views illustrating a part of a driver circuit of an LCD device according to the present invention.
Figure 2B:
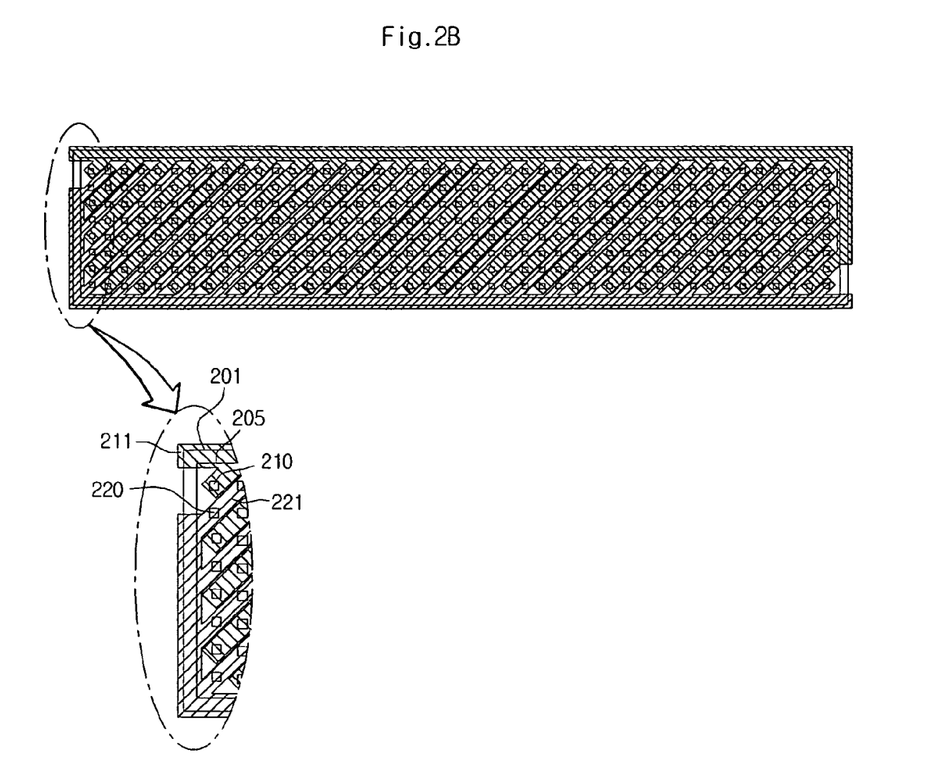

FIGS. 2A to 2C are schematic plan views illustrating a part of a driver circuit of an LCD device according to the present invention. While the discussion focuses on liquid crystal display devices, it is understood that the present invention is applicable to other display technologies as well, including organic light emitting diode (OLED) displays, for example.

A driver circuit includes a gate driver or a data driver mounted within an LC panel. The gate driver and the data driver have a plurality of shift registers. The shift registers have a plurality of TFTs for controlling outputs of the shift registers. To improve electrical characteristics (e.g., charge mobility, a current-driving ability) of the TFT, a channel width thereof should be large. A design structure for widening the channel width is illustrated in FIGS. 2A to 2C.

FIG. 2A is a schematic plan view of a general driver circuit.

As illustrated in FIG. 2A, source electrodes 210 and drain electrodes 220 constituting TFTs are arranged in zigzags. In that case, the channel width of the TFT is 24 μm, with a horizontal length being 1750 μm, a vertical length being 188 μm, and an area thereof being 315,000 μm$^2$.

FIG. 2B is a schematic plan view of a driver circuit of the present invention.

Referring to FIG. 2B, the driver circuit includes a gate electrode 201, a gate insulating layer (not illustrated) formed on the gate electrode 201, an active layer 205 formed on the gate insulating layer, drain electrodes 220 and source electrodes 210 alternately arranged in the form of an island on the gate electrode 201, drain lines 221 for electrically connecting the drain electrodes 220 formed in a diagonal direction, and source lines 211 for electrically connecting the source electrodes formed in a diagonal direction and alternately arranged with respect to the drain lines.

A passivation layer (not illustrated) having source contact holes and drain contact holes formed therein is formed on the source electrodes and the drain electrodes 210 and 220, and the source contact holes and drain contact holes expose predetermined regions of the source electrodes and the drain electrodes 210 and 220.

Source lines 211 are connected with the source electrodes 210 through the source contact holes and drain lines 221 are connected with the drain electrodes 220 through the drain contact holes.

The source lines 211 are incorporated into one line to receive a source signal, which is delivered to the source electrode having an island shape and connected with the source lines 211.

Also, the drain lines 221 are incorporated into one line to receive a drain signal, which is delivered to the drain electrode having an island shape and connected with the drain lines 221.

The source lines 211 and the drain lines 221 can be made of a transparent conductive material. The transparent conductive material may be indium-tin-oxide (ITO) or indium-zinc-oxide (IZO).

The source electrodes 210 and the drain electrodes 220 are formed in an island shape and alternately arranged in a vertical direction and a horizontal direction. In that case, the same source electrodes 210 and the same drain electrodes are arranged in a diagonal direction.

The source lines 211 should be connected with only the source electrodes 210 and the drain lines 221 should be connected with only the drain electrodes 220. Therefore, the source lines 211 and the drain lines 221 are arranged in a diagonal direction so as to connect with only the same source electrodes 210 and the same drain electrodes 220.

As a result of an experiment in which a layout is designed for the same area in comparison with the driver circuit of FIG. 2A, the driver circuit of FIG. 2B can secure a channel width of an about 30,700 μm, so that a channel width improvement of 28% is expected.

FIG. 2C is a schematic plan view of a driver circuit of the present invention.

The driver circuit includes mesh type TFTs which are the same as those of the driver circuit of FIG. 2B. An area required to obtain 24,000 μm, which is the channel width of the TFT of the driver circuit of FIG. 2A, can consist of a vertical width of 180 μm and a horizontal width of 1,360 μm. Therefore, a horizontal width reduction of 390 μm is achieved and thus the area is reduced to 244,880 μm², so that an area reduction of an about 29% is expected.

Figure 3:
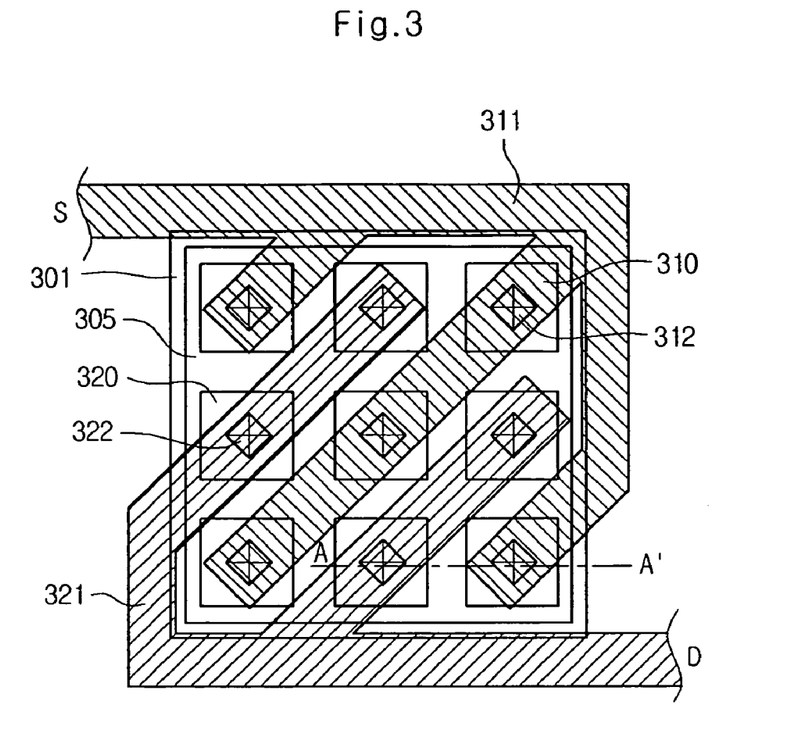
FIG. 3 is a plan view illustrating a part of a driver circuit of an LCD device according to the first embodiment of the present invention.
Figure 4:
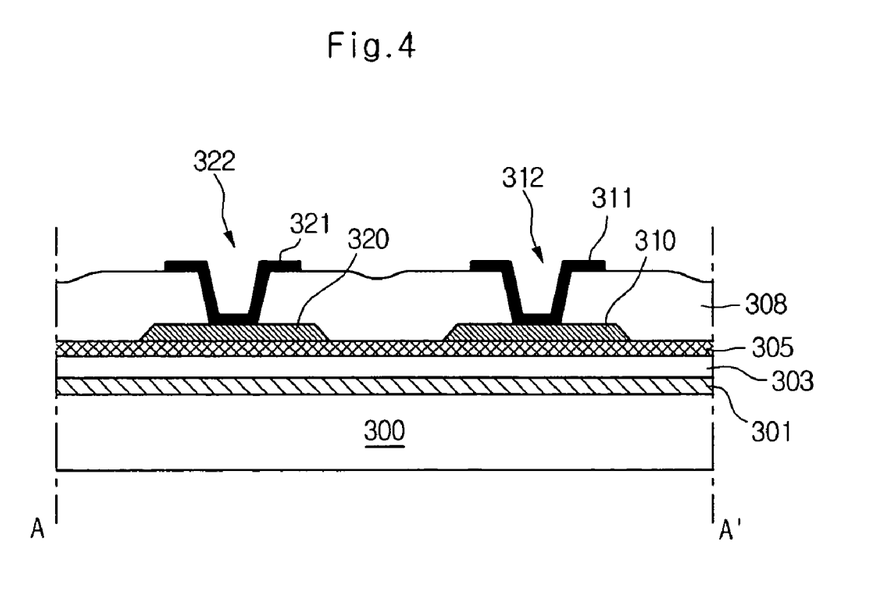
FIG. 4 is a sectional view taken along a line A-A' of FIG. 3.
Figure 5:
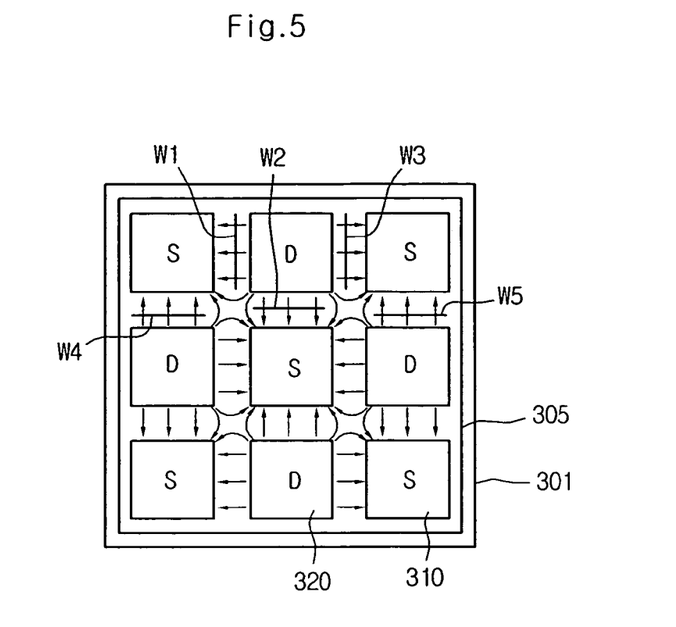
FIG. 5 is a schematic view illustrating movement of a current when a channel width and a channel of FIG. 3 are formed.

FIG. 3 is a plan view illustrating a part of a driver circuit of an LCD device according to the first embodiment of the present invention, FIG. 4 is a sectional view taken along a line A-A' of FIG. 3, and FIG. 5 is a schematic view illustrating movement of a current when a channel width and a channel of FIG. 3 are formed.

Referring to FIGS. 3 and 4, the driver circuit of an LCD device according to the first embodiment of the present invention includes a gate electrode 301 connected with a gate line (not illustrated) formed on a substrate 300, a gate insulating layer 303 formed on the gate electrode 301, an active layer 305 formed at the position of the gate electrode 301 on the gate insulating layer 303, source electrodes 310 and drain electrodes 320 alternately formed in an island shape on the active layer 305, a passivation layer 308 having source contact holes 312 and drain contact holes 322 for exposing predetermined regions of the source electrodes 310 and the drain electrodes 320, source lines 311 for connecting with the source electrodes 310 through the source contact holes 312 on the passivation layer 308, and drain lines 321 for connecting with the drain electrodes 320 through the drain contact holes 322 on the passivation layer 308.

The source lines 311 are integrally connected to each other and the drain lines 321 are connected with each other.

The source electrodes 310 and the drain electrodes 320 are formed in an island shape on the gate electrode 301. The source electrodes 310 and the drain electrodes 320 are alternately formed in a vertical direction and a horizontal direction. In that case, the same source electrodes 310 and the same drain electrodes 320 are arranged in a diagonal direction.

The source lines 311 should be connected with only the source electrodes 310 and the drain lines 321 should be connected with only the drain electrodes 320. Therefore, the source lines 311 and the drain lines 321 are arranged in a diagonal direction so as to connect with only the same source electrodes 310 and the same drain electrodes 320.

The source lines 311 and the drain lines 321 can be made of a transparent conductive material. The transparent conductive material may be indium-tin-oxide (ITO) or indium-zinc-oxide (IZO).

Therefore, the source lines 311 are formed in a diagonal direction to connect with the source electrodes 310 through the source contact hole 312. The drain lines 321 are alternately arranged with respect to the source lines 311 and connect with the drain electrodes 320 through the drain contact holes 322.

Referring to FIG. 5, the source electrodes 310 and the drain electrodes 320 arranged in an island shape are spaced from each other a predetermined interval and alternately arranged in a vertical direction and a horizontal direction.

Where only the gate electrode 301, the active layer 305, and the source and drain electrodes 310 and 320 are illustrated, channel widths may be W1, W2, W3, and W4 when the channels are formed between the source electrodes 310 and the drain electrodes 320. That is, since the channel width is formed along four edges of the source electrodes 310 and the drain electrodes 320, the channel width is maximized.

Therefore, the present invention has a mesh type TFT having a maximized channel width, so that a bezel size, which is a non-display region of a screen, is reduced to make the size of the LC panel compact and to improve electrical properties of the TFT and to be able to minimize the area occupied by the driver circuit.

The present invention can maximize an area use rate by providing a mesh type TFT in those applications in which area is limited.

Particularly, the present invention provides are marked improvement when forming a TFT using an amorphous silicon (a-Si), microcrystal, or organic compound where mobility of an element is considerably low.

As described above, the present invention minimizes a circuit occupying area within the LC panel when manufacturing the LC panel having the driver circuit therein.

Figure 6:
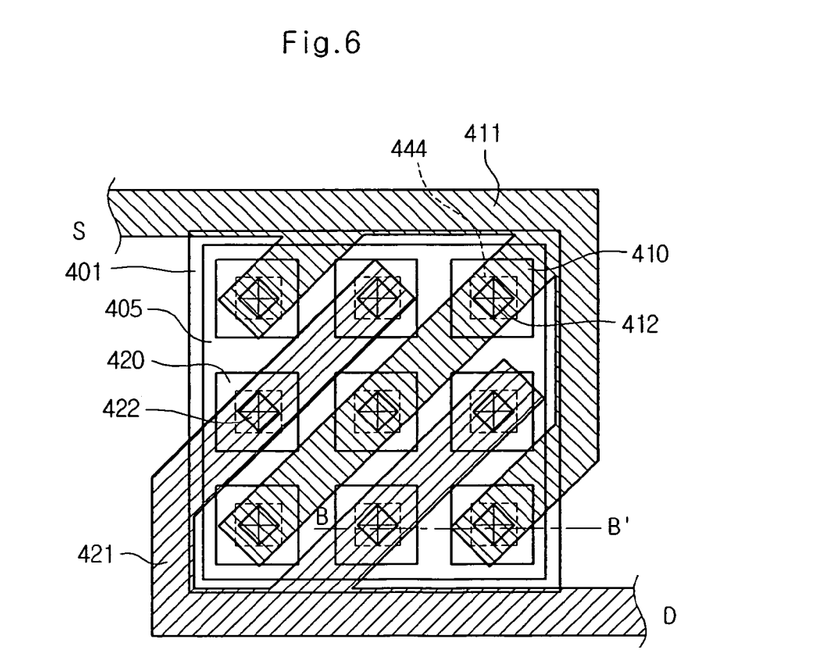
FIG. 6 is a plan view illustrating a part of a driver circuit of an LCD device according to the second embodiment of the present invention.
Figure 7:
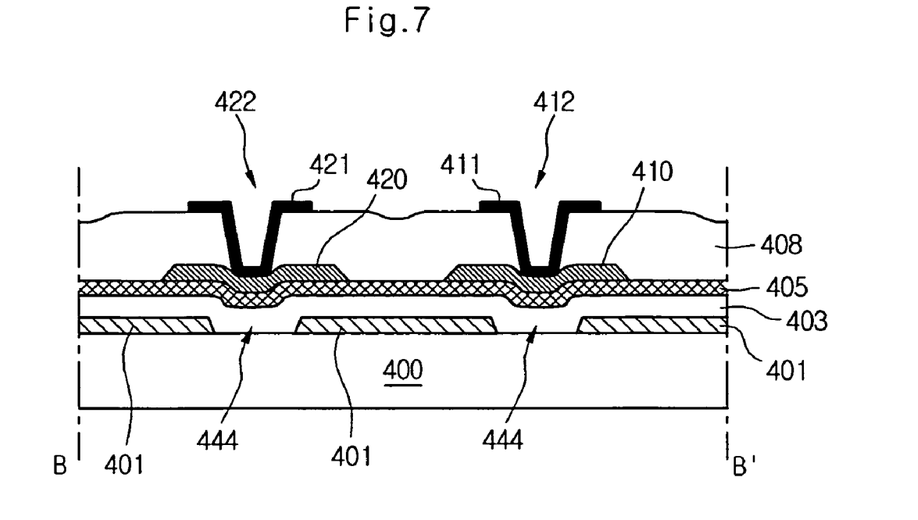
FIG. 7 is a sectional view taken along a line B-B' of FIG. 6.
Figure 8:
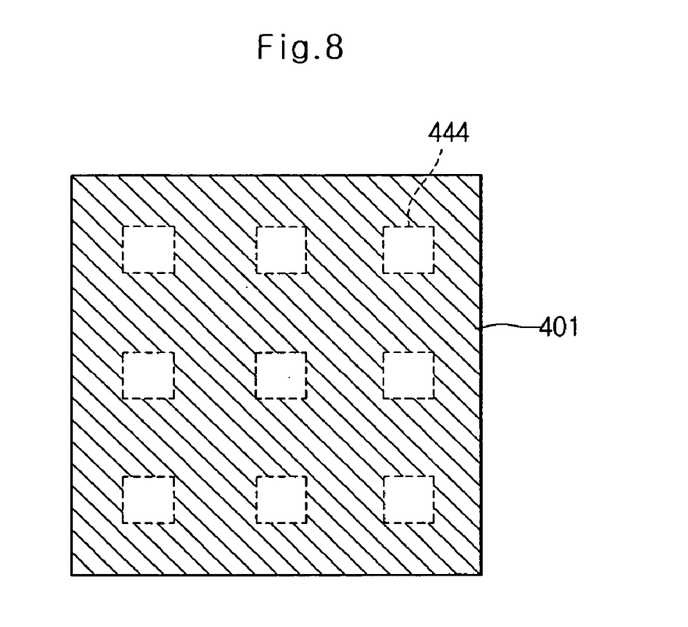
FIG. 8 is a plan view illustrating only a gate electrode in FIGS. 6 and 7.

FIG. 6 is a plan view illustrating a part of a driver circuit of an LCD device according to the second embodiment of the present invention, FIG. 7 is a sectional view taken along a line B-B' of FIG. 6, and FIG. 8 is a plan view illustrating only a gate electrode in FIGS. 6 and 7.

Referring to FIGS. 6 to 8, the driver circuit of an LCD device includes a gate electrode 401 connected with gate lines (not illustrated) formed on a substrate 400 and having gate holes 444, a gate insulating layer 403 formed on the gate electrode 401, an active layer 405 formed at the position of the gate electrode 401 on the gate insulating layer 403, source electrodes 410 and drain electrodes 420 alternately formed in an island shape on the active layer 405, a passivation layer 408 having source contact holes 412 and drain contact holes 422 for exposing predetermined regions of the source electrodes 410 and the drain electrodes 420, source lines 411 for connecting with the source electrodes 410 through the source contact holes 412 on the passivation layer 408, and drain lines 421 for connecting with the drain electrodes 420 through the drain contact holes 422 on the passivation layer 408.

The gate holes 444 are formed in positions that correspond to the positions of the source electrodes 410 and the drain electrodes 420, which are intended for reducing parasitic capacitance by reducing capacitance Cgs between the source electrode 410 and the gate electrode 401 and capacitance Cgd between the drain electrode 420 and the gate electrode 401.

The source lines 411 are integrally connected to each other and the drain lines 421 are connected with each other.

The source electrodes 410 and the drain electrodes 420 are formed in an island shape on the gate electrode 401. The source electrodes 410 and the drain electrodes 420 are alternately formed in a vertical direction and a horizontal direction. In that case, the same source electrodes 410 and the same drain electrodes 420 are arranged in a diagonal direction.

Therefore, the source lines 411 are formed in a diagonal line to connect with the source electrodes 410 through the source contact holes 421. Also, the drain lines 421 are alternately arranged with respect to the source lines 411 to connect with the drain electrodes 420 through the drain contact holes 422.

The source electrodes 410 and the drain electrodes 420 arranged in an island shape are spaced from each other a predetermined interval and alternately arranged in a vertical direction and a horizontal direction. For example, the source electrodes 410 are arranged up and down, and right and left around the drain electrode 420. Therefore, since four channel widths exist between one drain electrode 420 and the four source electrodes 410, one drain electrode has four channel widths compared with the case where one source electrode is arranged at one drain electrode.

Therefore, the present invention can reduce parasitic capacitance Cgs and Cgd between the gate electrode 401 and the source electrode 410, and between the gate electrode 401 and the drain electrode 420 to improve electrical properties of a TFT by forming gate holes 444 where the gate electrode does not exist at positions that correspond to the source electrodes 410 and the drain electrodes 420.

Also, the present invention has a mesh type TFT having a maximized channel width, so that a bezel size, which is non-display area in a screen, is reduced, which makes the LC panel compact, improves electrical properties of the TFT, and minimizes the area occupied by the driver circuit.

The present invention can maximize an area use rate by providing a mesh type TFT in those applications in which area is limited.

Particularly, the present invention has a remarkable effect when forming a TFT using an amorphous silicon (a-Si), microcrystal, or organic compound where mobility of an element is considerably low.

As described above, the present invention minimizes the area occupied by the circuit within the LC panel when manufacturing the LC panel having the driver circuit therein.

The present invention uses the mesh type TFT having a maximized channel width, so that the driver circuit can be mounted within the LC panel even in the cases where a TFT is formed using amorphous silicon (a-Si), microcrystal, and organic semiconductor having low mobility. Therefore, fabrication yield improves and fabrication method is simplified.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A display device comprising:
    a driver circuit having a plurality of thin film transistors (TFTs) for controlling outputs; and
    a display panel for displaying an image in response to a signal outputted from the driver circuit,
    each of the TFTs comprising:
    a gate electrode;
    an active layer formed on the gate electrode;
    source electrodes and drain electrodes alternately arranged with respect to each other in the form of an island;
    a passivation layer having a source contact hole and a drain contact hole for exposing predetermined regions of the source electrode and the drain electrode; and
    source lines and drain lines connected with the source electrodes and the drain electrodes, respectively,
    wherein the source electrodes arranged in a diagonal direction are connected with the source lines and the drain electrodes arranged in a diagonal direction are connected with the drain lines,
    wherein the gate electrode is formed in the form of an island, and
    wherein the gate electrode has a plurality of gate holes that correspond to the source electrodes and the drain electrodes.

2. The display device of claim 1, wherein the source lines and the drain lines are alternately arranged.

3. The display device of claim 1, wherein the source electrodes and the drain electrodes are alternately arranged in a horizontal direction.

4. The display device of claim 1, wherein the source electrodes and the drain electrodes are alternately arranged in a vertical direction.

5. The display device of claim 1, wherein the source electrodes arranged along a diagonal direction are the same electrodes.

6. The display device of claim 1, wherein the drain electrodes arranged along a diagonal direction are the same electrodes.

7. The display device of claim 1, wherein the source lines are integrally formed and the drain lines are integrally formed.

8. The display device of claim 1, wherein the source electrode have channels formed with respect to drain electrodes adjacent thereto.

9. The display device of claim 1, wherein the drain electrodes have a channel formed with respect to source electrodes adjacent thereto.

* * * * *